(12) United States Patent
Rhee et al.

(10) Patent No.: US 6,377,129 B1
(45) Date of Patent: Apr. 23, 2002

(54) PROGRAMMABLE RELAXATION OSCILLATOR

(75) Inventors: Woogeun Rhee, Irvine; Akbar Ali, Garden Grove, both of CA (US)

(73) Assignee: Conexant Systems, Inc., Newport Beach, CA (US)

(*) Notice: Subject to any disclaimer, the term of this patent is extended or adjusted under 35 U.S.C. 154(b) by 0 days.

(21) Appl. No.: 09/302,754

(22) Filed: Apr. 30, 1999

(51) Int. Cl.⁷ ............................................. H03K 3/282
(52) U.S. Cl. ...................... 331/111; 331/143; 331/144; 331/113 R; 331/36 C; 331/34
(58) Field of Search ............................ 331/144, 113 R, 331/36 C, 34, 111, 143

(56) References Cited

U.S. PATENT DOCUMENTS

| | | | |
|---|---|---|---|
| 3,559,096 A | * | 1/1971 | Lokerson ...................... 331/34 |
| 4,812,784 A | * | 3/1989 | Chung et al. ............ 331/113 R |
| 5,357,220 A | * | 10/1994 | Francis .................... 331/113 R |

OTHER PUBLICATIONS

"A 20–800 MHz Relaxation Oscillator with Automatic Swing Control"; T. Sowlati & H. Shakiba, IEEE International Solid–State Circuits Conference, Session 14, Paper FP 14.5, 1998.

* cited by examiner

Primary Examiner—Arnold Kinkead
(74) Attorney, Agent, or Firm—Procopio, Cory, Hargreaves & Savitch LLP

(57) ABSTRACT

An oscillator has a slope-fixing circuit that generates a control signal and fixes the slope of the control signal, a swing-fixing circuit that fixes the swing of the control signal, and a switching block that generates an output signal having a frequency derived from the swing and the slope of the control signal. The slope-fixing circuit comprises a fixed timing capacitor $C_1$ in parallel with a plurality of switchable timing capacitors $C_2 \ldots C_N$ to provide an effective capacitance C. The slope of the control signal is determined by the ratio of a control current I to the effective capacitance C. The swing-fixing circuit comprises a replica cell that accepts a programmable reference voltage $V_{REF}$ and provides a fixed voltage swing $V_{SW}=V_{DD}-V_{REF}$ across a pair of load transistors. The switching block comprises a pair of switching transistors that alternate between "on" and "off" states depending on the value of the control signal to produce an oscillating output signal. The frequency of the output signal is given by $$\frac{I}{4CV_{SW}}.$$

40 Claims, 11 Drawing Sheets

PROGRAMMABLE RELAXATION OSCILLATOR

FIELD OF THE INVENTION

The present invention relates generally to a voltage- or current-controlled oscillator and, more particularly, relates to a voltage- or current-controlled relaxation oscillator having a programmable gain.

BACKGROUND OF THE INVENTION

Many electrical and computer applications and components have critical timing requirements that compel generation of periodic clock waveforms that are precisely synchronized with a reference clock waveform. A phase-locked loop ("PLL") is one type of circuit that is widely used to provide an output signal having a precisely controlled frequency that is synchronous with the frequency of a reference or input signal. Wireless communication devices, frequency synthesizers, multipliers and dividers, single and multiple clock generators, and clock recovery circuits are but a few examples of the manifold implementations of PLLs.

Frequency synthesis is a particularly common technique used to generate a high frequency clock from a lower frequency reference clock. In microprocessors, for example, an on-chip PLL can multiply the frequency of a low frequency input (off-chip) clock, typically in the range of 1 to 4 MHz, to generate a high frequency output clock, typically in the range of 10 to over 200 MHz, that is precisely synchronized with the lower frequency external clock. Another common use of PLLs is recovery of digital data from serial data streams by locking a local clock signal onto the phase and frequency of the data transitions. The local clock signal is then used to clock a flip-flop or latch receiving input from the serial data stream.

FIG. 1 is a block diagram of a typical PLL 10. PLL 10 comprises phase/frequency detector 12, charge pump 14, loop filter 16, voltage-controlled oscillator ("VCO") 18 and frequency divider 20. PLL 10 receives a reference clock signal $CLK_{REF}$ and generates an output clock signal $CLK_{OUT}$ aligned to the reference clock signal in phase. The output clock frequency is typically an integer (N) multiple of the reference clock frequency; with the parameter N set by frequency divider 20. Hence, for each reference signal period, there are N output signal periods.

Phase/frequency signal detector 12 receives on its input terminals two clock signals $CLK_{REF}$ and $CLK^*_{OUT}$ ($CLK_{OUT}$, with its frequency is divided down by frequency divider 20). In a conventional arrangement, detector 12 is a rising edge detector that compares the rising edges of the two clock signals. Based on this comparison, detector 12 generates one of three states. If the phases of the two signals are aligned, the loop is "locked". Neither the UP nor the DOWN signal is asserted and VCO 18 continues to oscillate at the same frequency. If $CLK_{REF}$ leads $CLK^*_{OUT}$, than VCO 18 is oscillating too slowly and detector 12 outputs an UP signal proportional to the phase difference between $CLK_{REF}$ and $CLK^*_{OUT}$. Conversely, if $CLK_{REF}$ lags $CLK^*_{OUT}$, than VCO 18 is oscillating too quickly and detector 12 outputs a DOWN signal proportional to the phase difference between $CLK_{REF}$ and $CLK^*_{OUT}$. The UP and DOWN signals typically take the form of pulses having a width or duration corresponding to the timing difference between the rising edges of the reference and output clock signals.

Charge pump 14 generates a current $I_{CP}$ that controls the oscillation frequency of VCO 18. $I_{CP}$ is dependent on the signal output by phase/frequency detector 12. If charge pump 14 receives an UP signal from detector 12, indicating that $CLK_{REF}$ leads $CLK^*_{OUT}$, $I_{CP}$ is increased. If charge pump 14 receives a DOWN signal from detector 12, indicating that $CLK_{REF}$ lags $CLK^*_{OUT}$, $I_{CP}$ is decreased. If neither an UP nor a DOWN signal is received, indicating that the clock signals are aligned, charge pump 14 does not adjust $I_{CP}$.

Loop filter 16 is positioned between charge pump 14 and VCO 18. Application of the charge pump output current $I_{CP}$ to loop filter 16 develops a voltage $V_{LF}$ across filter 16. $V_{LF}$ is applied to VCO 18 to control the frequency of the output clock signal. Filter 16 also removes out-of-band, interfering signals before application of $V_{LF}$ to VCO 18. A common configuration for a loop filter in a PLL is a simple single-pole, low-pass filter that an be realized with a single resistor and capacitor.

The oscillator is the subject of the present invention. VCO 18 generates an oscillating output signal $CLK_{OUT}$ having a frequency proportional to the voltage $V_{LF}$ applied to VCO 18. Conventional voltage-controlled oscillators typically oscillate about a specific center frequency and have a relatively narrow frequency range or bandwidth. When $CLK_{REF}$ leads $CLK^*_{OUT}$, charge pump 14 increases $I_{CP}$ to develop a greater $V_{LF}$ across loop filter 16 which, in turn, causes VCO 18 to increase the frequency of $CLK_{OUT}$. Conversely, When $CLK_{REF}$ lags $CLK^*_{OUT}$, charge pump 14 decreases $I_{CP}$ to develop a lesser $V_{LF}$ across loop filter 16 which, in turn, causes VCO 18 to decrease the frequency of $CLK_{OUT}$. When $CLK_{REF}$ and $CLK^*_{OUT}$ are aligned, $V_{LF}$ is not adjusted, and the oscillation frequency of VCO 18 is kept constant. In this state, PLL 10 is in a "locked" condition.

The output clock signal is also looped back through (in some applications) frequency divider 20. The resultant output $CLK^*_{OUT}$ is provided to phase/frequency detector 12 to facilitate the phase-locked loop operation. Frequency divider 20 facilitates comparison of the generally higher frequency output clock signal with the lower frequency reference clock signal by dividing the frequency of $CLK_{OUT}$ by the multiplication factor N. Divider 20 may be implemented using trigger flip-flops, or through other methods familiar to those of ordinary skill in the art. Thus, PLL 10 compares the reference clock phase to the output clock phase and eliminates any detected phase difference between the two by adjusting the frequency of the output clock.

Fully monolithic phase-locked loops formed from complementary metal-oxide-semiconductor ("CMOS") field effect transistors ("FET") are widely used in many applications. The widespread industrial capability to mass-produce CMOS circuits facilitates the manufacture of inexpensive basic tuning devices employing PLLs for products such as wireless telephones. Since the power consumption of the PLL derives primarily from the on-chip oscillator, the power consumed by the PLL increases as the operating frequency of the oscillator increases. The goal of achieving high frequency operation is thus inconsistent with low power consumption. In addition to lower power consumption, an oscillator having a wide linear range is desirable for optimal PLL performance. Accordingly, there is a need for a low power, high frequency oscillator that has a wide linear range and is designed with CMOS technology.

FIGS. 2a, 2b and 2c depict three CMOS oscillator architectures. FIG. 2a depicts a CMOS-based differential ring oscillator 30. Ring oscillator 30 is comprised of a plurality of differential inverters 32 connected in cascade, with the output of the last inverter in the series being connected to the input of the first inverter. This oscillator design is problematic in that it is very sensitive to process and temperature variations. The nominal output frequency of a conventional CMOS differential ring oscillator, for example, may range from 700 MHz to 1.3 GHz. This represents almost a 100% frequency variation. This sensitivity stems from the inverse relationship between the delay time of the inverters and the output frequency. A PLL based on a ring oscillator requires an increased VCO gain in order to obtain the necessary range to deal with these wide frequency variations. The increased VCO gain leads to poor phase performance and increased sensitivity.

FIG. 2b depicts a typical relaxation oscillator 40 having a grounded timing capacitor 42. Current sources 46 and 48 together provide a switching current i=±kv$_{in}$, where v$_{in}$ is a control voltage for capacitor 42. The voltage developed across capacitor 42, V$_c$, is applied to Schmitt trigger circuit 44. When i=+kv$_{in}$, current source 46 is connected, and capacitor 42 begins to charge. Trigger circuit 44 generates an output voltage v$_o$ that remains a logical one until v$_c$ reaches the high threshold voltage v$_H$ of Schmitt trigger 44. At this time, v$_o$ drops to a logical zero, current sources 46 and 48 are switched such that i=−kv$_{in}$, and capacitor 42 begins to discharge. As capacitor 42 is discharging, v$_o$ remains a logical zero until v$_c$ reaches the low threshold voltage v$_L$ of Schmitt trigger 44. At this time, v$_o$ jumps back to a logical one, current sources 46 and 48 are switched such that i=+kv$_{in}$, and capacitor 42 begins to recharge. In this manner, an oscillating output is produced, with the charging and discharging time of capacitor 42 constituting a period.

The frequency of oscillator 40 is dependent upon and characterized by the current provided by current sources 46 and 48, the capacitance of capacitor 42, and the reference voltage. Accordingly, relaxation oscillator 40 is less sensitive to process and temperature variations relative to the CMOS-based differential ring oscillator described above. As the capacitance increases, however, the discharging operation takes longer and consequently, the attainable frequency and sensitivity of oscillator 40 decreases. Moreover, at high speeds, the delay time introduced by Schmitt trigger 44 plays a significant role in determining the oscillation period.

FIG. 2c shows a source-coupled, current-controlled relaxation oscillator 60 with a floating timing capacitor 62. Oscillator 60 includes a pair of n-channel CMOS transistors M3 and M4 having their gates and drains coupled to supply voltage V$_{DD}$, and their sources coupled to, respectively, the drains of n-channel CMOS transistors M1 and M2. The gate of M1 is cross-coupled to the source of M4, and the gate of M2 is cross-coupled to the source of M3. Timing capacitor 62 is connected between the sources of transistors M1 and M2 and grounded current sources 64 and 66.

Oscillator 60 generates oscillating output voltages V$_{O1}$ and V$_{O2}$ as follows. In an initial state, with transistor M1 off and transistor M2 on, no current flows through transistor M1 and the current flowing through transistor M2 is 2I. Assuming that the current is large enough to turn transistor M4 on, and neglecting gate currents, the current flowing through transistor M4 is also 2I. Accordingly, the voltage V$_{O2}$ is at least one threshold drop below supply voltage V$_{DD}$. Conversely, since transistors M1 and M3 (by virtue of M1 being off) are off, no current flows through these transistors and the output voltage V$_{O1}$ is essentially equal to the supply voltage V$_{DD}$.

In this initial condition, a current I passes through capacitor 62 in the direction towards current source 64, and begins to charge capacitor 62. As capacitor 62 charges, the source of transistor M1 gradually becomes more negatively charged. Eventually, the gate-to-source voltage drop across transistor M1 becomes great enough to turn transistor M1 on. The resulting voltage drop at the source of transistor M3 also turns transistor M3, and the voltage drop at the gate of transistor M2 (through its coupling to the source of transistor M3) turns transistors M2 and M4 off. A current 2I now flows through transistors M3 and M1, and a current I flows through capacitor 62 in the opposite direction (towards current source 66). By virtue of the current flow, the output voltage V$_{O1}$ drops from V$_{DD}$. When that voltage has dropped to at least the threshold voltage below V$_{DD}$, transistors M1 and M3 turn on, and transistors M2 and M4 turn off. As no current flows through transistors M4 and M2, the output voltage V$_{O2}$ rises to V$_{DD}$. Capacitor 62 begins discharge until the voltage at the source of transistor M2 becomes negative enough to turn transistor M2 on. In this manner, output voltages V$_{O1}$ and V$_{O2}$ take the form of oscillating square waves (180° out-of-phase). The oscillation frequency is determined largely by the capacitance of capacitor 62.

A relaxation oscillator having a floating timing capacitor, as illustrated and described with reference to FIG. 2c, presents several advantages. It has only one stage, its symmetric architecture minimizes power consumption, and its differential operation provides a fifty percent duty cycle, which is a desirable attribute in those applications in which the elimination of even harmonics is important. A control voltage from a loop filter is passed through a voltage-to-current converter (not shown), and the voltage-to-current converter outputs a current I. Due to the use of nonlinear load transistors M3 and M4, however, oscillator 60 exhibits a highly nonlinear voltage-to-frequency characteristic. This nonlinear characteristic makes it difficult to control the output frequency by varying I, and also makes it difficult to control the gain or sensitivity. This problem is magnified when CMOS technology is used, since the CMOS diode characteristic is poorer than the bipolar diode characteristic. For these reasons, this architecture is generally not viewed as suitable for CMOS oscillators.

In view of the above, there is a need for a low-power, low-noise CMOS oscillator with an improved voltage-to-frequency characteristic and a more precisely controllable output frequency.

SUMMARY OF THE INVENTION

In accordance with the purpose of the invention as broadly described herein, there is provided a relaxation oscillator. The oscillator has a simple and symmetric structure, a digitally programmable gain and may be voltage- or current-controlled.

In a first embodiment of the present invention, an oscillator comprises a slope-fixing circuit that generates a control signal and fixes the slope of the control signal. The oscillator further comprises a swing-fixing circuit that fixes the swing of the control signal, and a switching block that generates an output signal. The output signal has a frequency derived from the swing and the slope of the control signal.

In one implementation of the first embodiment, the slope-fixing circuit comprises a fixed timing capacitor $C_1$ and a plurality of switchable timing capacitors $C_2 \ldots C_N$. The effective capacitance C is programmable through the placement of selected ones of timing capacitors $C_2 \ldots C_N$ in parallel with fixed timing capacitor $C_1$. The slope of the control signal is determined by the ratio of a control current I to the effective capacitance C. The swing-fixing circuit comprises a replica cell that provides a fixed voltage swing $V_{SW}$, and a pair of load transistors that the voltage swing is applied across. The voltage swing $V_{SW}$ is programmable by setting a reference voltage $V_{REF}$, which is provided to the gates of the load transistors by the replica cell, to one of a plurality of incremental reference voltages $V_{REF1}$ ... $V_{REFM}$. The voltage swing $V_{SW}$ is given by the difference between a supply voltage $V_{DD}$ and the reference voltage, $V_{SW}=V_{DD}-V_{REF}$. The switching block comprises a pair of switching transistors that alternate between "on" and "off" states depending on the value of the control signal to produce an oscillating output signal. The frequency of the output signal is given by $$\frac{I}{4CV_{SW}}.$$

In second embodiment of the present invention, a relaxation oscillator integrated on a single semiconductor chip is provided. It comprises a voltage-to-current converter for generating a control current I from an input voltage. A current-controlled oscillator generates an oscillating output signal from the control current I and an internal control signal. The current-controlled oscillator comprises at least one timing capacitor having an effective capacitance C that fixes the slope of the control signal as I/C. A pair of load transistors fixes the voltage swing $V_{SW}$ of the control signal. A pair of switching transistors coupled between the at least one capacitor and the load transistors generates the oscillating output signal based on the internal control signal. The relaxation oscillator further comprises a replica cell that provides a reference voltage $V_{REF}$ to the load transistors to fix the voltage swing $V_{SW}$ across the load transistors.

In one implementation of the second embodiment, the voltage-to-current converter comprises a control transistor having its gate coupled to the input voltage and a resistor coupled between the source of the transistor and ground for generating the control current I. A cascoded transistor current mirror mirrors the control current I from the voltage-to-current converter to the current-controlled oscillator. The replica cell comprises an operational amplifier that accepts the reference voltage $V_{REF}$ and regulates the load transistors of the current controlled oscillator to maintain the voltage swing $V_{SW}$ at a fixed value.

A third embodiment of the present invention provides a phase-locked loop. The phase-locked loop comprises a phase/frequency detector that compares a reference clock signal with an output clock signal and generates an appropriate charge pump control voltage. A charge pump is coupled to the phase/frequency detector and generates a loop filter control current from the charge pump control voltage. A loop filter is coupled to the charge pump and generates a loop filter voltage from the loop filter control current. An oscillator is coupled to the loop filter. The oscillator comprises a slope-fixing circuit that receives the loop filter voltage and generates a control signal having a fixed slope, a swing-fixing circuit that fixes the swing of the control signal; and a switching block that generates the output clock signal. The output clock signal has a frequency derived from the swing and slope of the control signal. A feedback circuit is coupled between the oscillator and the phase/frequency detector and provides the output clock signal to the phase/frequency detector.

In one implementation of the third embodiment, the slope-fixing circuit comprises a fixed timing capacitor $C_1$ and a plurality of switchable timing capacitors $C_2 \ldots C_N$ that provides an effective capacitance C. A current supply provides a control current I, yielding a control signal having a slope I/C. The feedback circuit comprises a frequency divider that divides the frequency of the output clock signal by a division factor N. The division factor N is provided by a programming signal. This implementation further comprises a decoder coupled to the oscillator that also receives the programming signal. Based on the programming signal, the decoder programs the slope-fixing means to generate a particular effective capacitance C.

In one method according to the present invention, an oscillating output signal $V_O$ is generated. The method comprises the following steps:

(a) fixing a voltage swing $V_{SW}$ across a variable resistance load;

(b) fixing an effective timing capacitance C;

(c) providing a control current I;

(d) deriving a control signal slope from the control current I and the effective timing capacitance C;

(e) setting a control signal $V_C$ to an initial value based on the voltage swing (f) outputting the signal $V_O$ at an initial level or at a switched level;

(g) decreasing the control signal $V_C$ along the control signal slope;

(h) continuing to output the signal $V_O$ at the current level as long as the change in the control voltage $\Delta V_C$ does not exceed a threshold voltage $V_T$;

(i) switching the level of the output signal $V_O$ when $\Delta V_C$ exceeds the threshold voltage $V_T$;

(j) repeating the method beginning with step (e) if the control current I has not changed; and (k) repeating the method beginning with step (d) if the control current I has changed.

In an implementation of this method, the voltage swing $V_{SW}$ is fixed according to the relationship $V_{SW}=V_{DD}-V_{REF}$, wherein $V_{DD}$ is a supply voltage and the reference voltage $V_{REF}$ is digitally programmable from a range of incremental reference voltages $V_{REF1} \ldots V_{REFM}$ to yield a corresponding range of swing voltages. The effective timing capacitance C is fixed by placing appropriate switchable timing capacitors $C_2 \ldots C_N$ in parallel with a fixed capacitor $C_1$.

In another method according to the present invention, a method for programming the gain or sensitivity $K_O$ of an oscillator, wherein $$K_0 = \frac{1}{4CV_{SW}},$$

is provided. The method includes the steps of determining the desired gain $K_O$, coarse-tuning the oscillator by selecting an effective capacitance C to achieve the desired gain $K_O$ and fine-tuning the oscillator by selecting a voltage swing $V_{SW}$ to achieve the desired gain $K_O$.

Objects and advantages of the present invention include any of the foregoing, singly or in combination. Further objects and advantages will be apparent to those of ordinary skill in the art, or will be set forth in the following disclosure.

BRIEF DESCRIPTION OF THE DRAWINGS

The present invention is described with reference to the accompanying drawings. In the drawings, like reference numbers indicate identical or functionally similar elements.

DETAILED DESCRIPTION OF PREFERRED EMBODIMENTS

Figure 1:
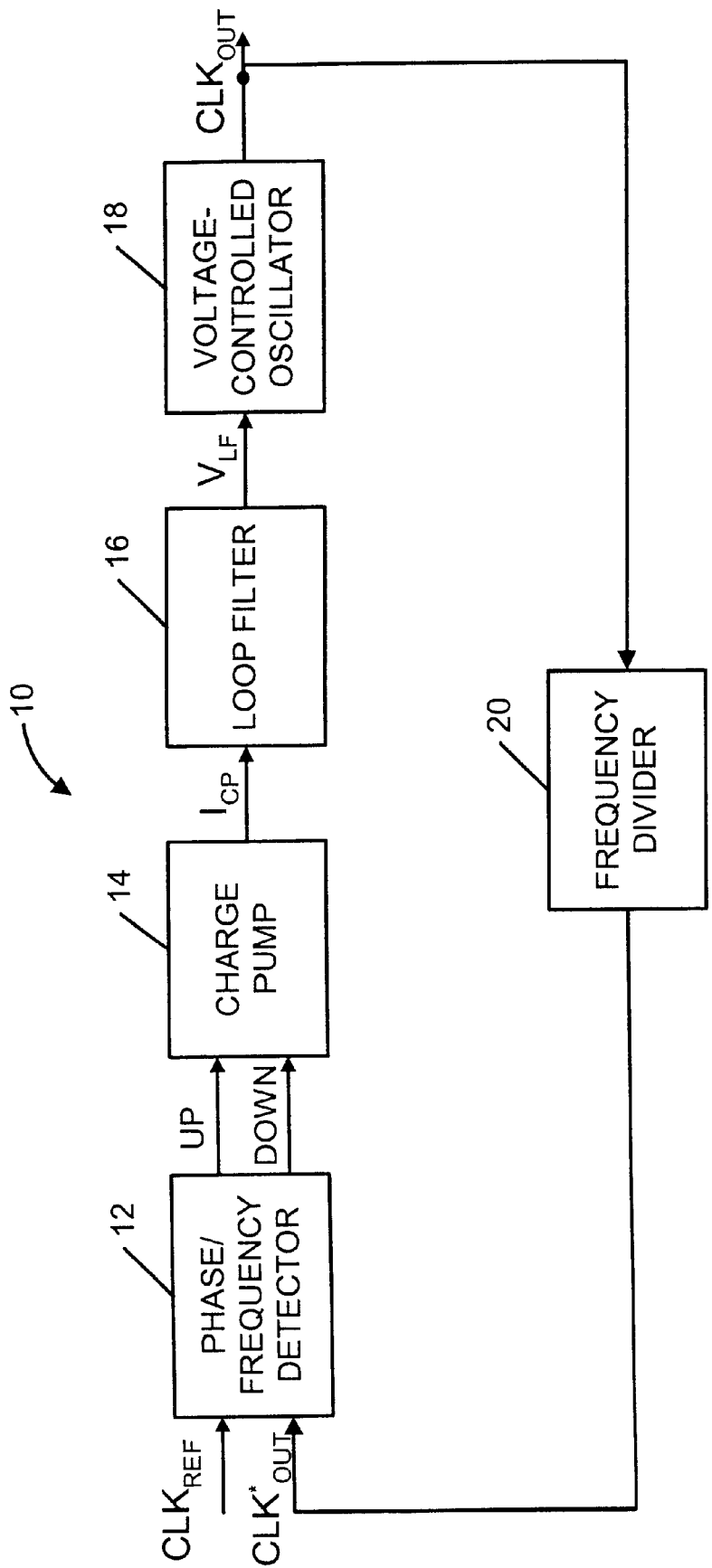
FIG. 1 is a block diagram illustrating the architecture of a typical phase-locked loop.
Figure 3:
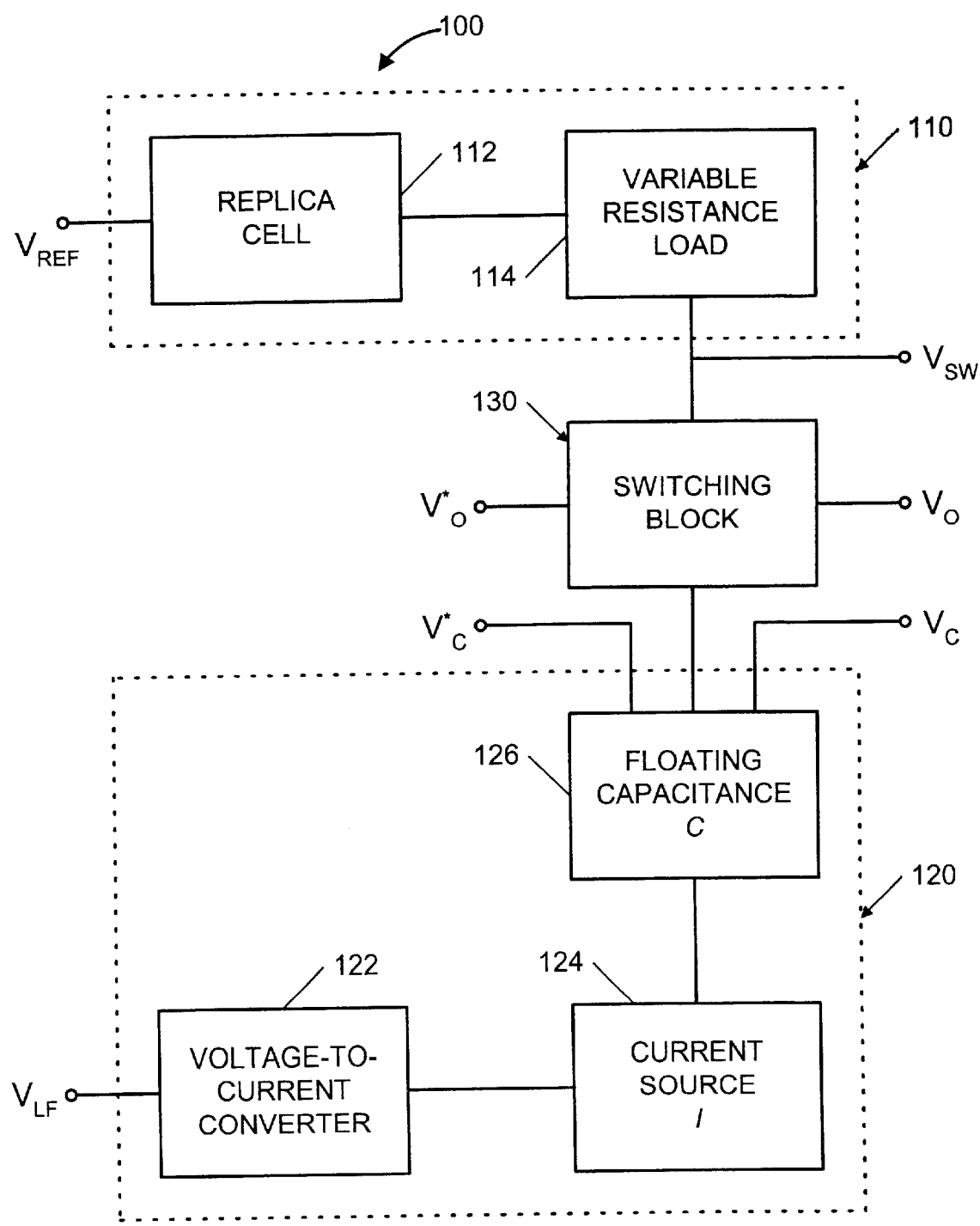
FIG. 3 is a block diagram of a relaxation oscillator according to the present invention.

A first embodiment of a relaxation oscillator 100 according to the present invention is illustrated in block form in FIG. 3. Relaxation oscillator 100 may be incorporated into a conventional phase-locked loop such as phase-locked loop 10 illustrated in FIG. 1, and may take the form of a current- or a voltage-controlled oscillator.

Oscillator 100 comprises a swing fixing circuit 110 having a replica cell 112 and a variable resistance load 114; a slope fixing circuit 120 having a voltage-to-current converter 122, a current source 124 and a floating capacitance 126; and a switching block 130. Swing fixing circuit 110 is programmable with a reference voltage $V_{REF}$ to fix a swing voltage $V_{SW}$. Slope fixing circuit 120 provides a control voltage $V_C$ (and 180°-offset control voltage $V^*_C$) that has a slope determined by the ratio of a control current I to a capacitance C. The capacitance C is programmable, and the current I has a value corresponding to the phase difference between a reference clock signal and an output clock $V_O$, which phase difference is represented by the value of the loop filter voltage $V_{LF}$ input to oscillator 100. Together, the swing and slope values define the frequency of clock signal $V_O$ (and 180°-offset output signal $V^*_O$) output by switching block 130. Hence, the frequency of output clock signal $V_O$ may be "fine-tuned" through the selection of $V_{REF}$ and "coarse-tuned" through the selection of C.

Figure 4:
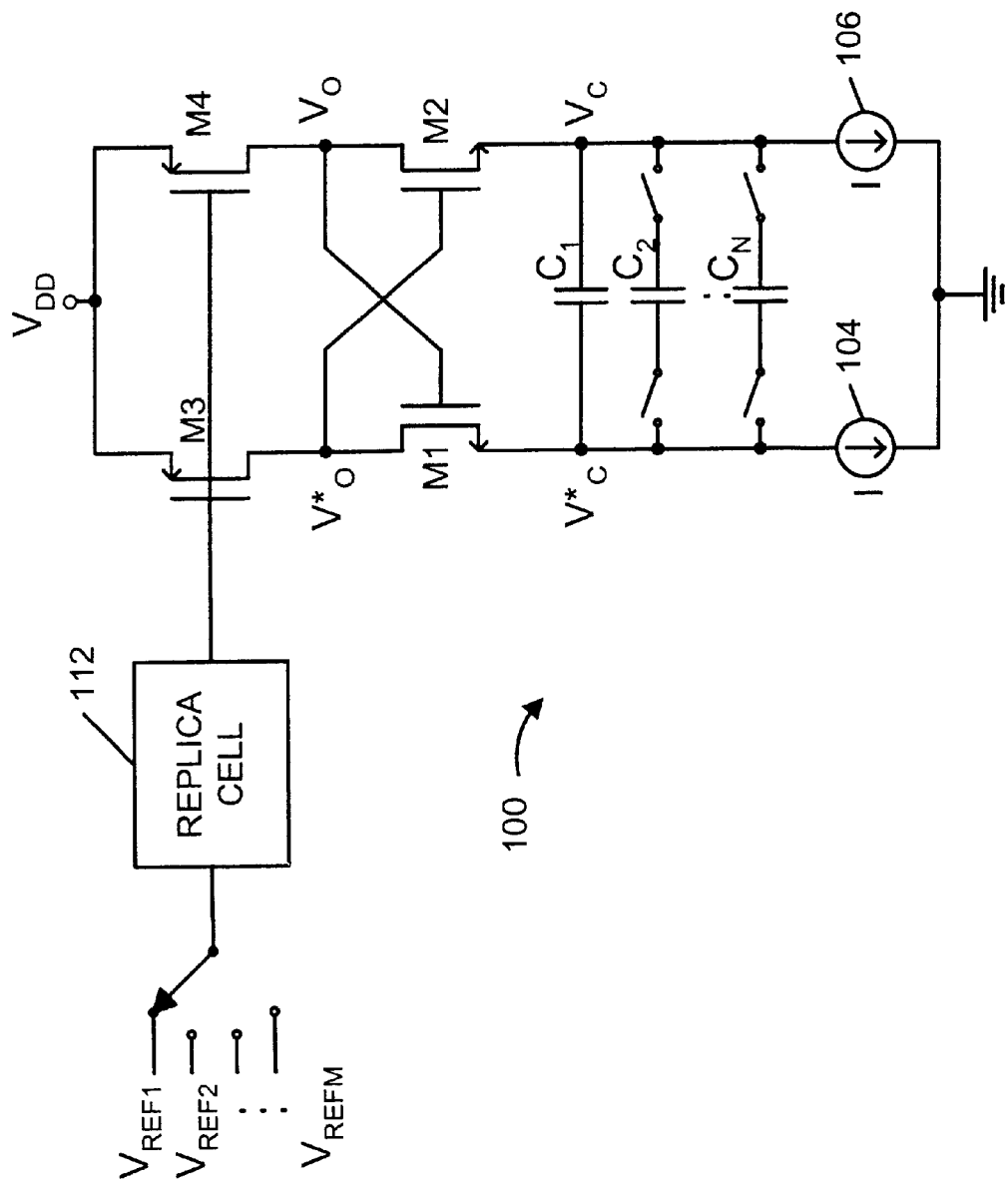
FIG. 4 is a partial circuit diagram of a relaxation oscillator according to the present invention.

Relaxation oscillator 100 is illustrated in greater detail in FIG. 4. Swing fixing circuit 110 is implemented by replica cell 112 and p-channel CMOS load transistors M3 and M4. The sources of transistors M3 and M4 are coupled to supply voltage $V_{DD}$ and the gates of transistors M3 and M4 are coupled to replica cell 112. The reference voltage $V_{REF}$ provided by replica cell 112 is programmable to fix the voltage swing $V_{SW}$ across load transistors M3 and M4, wherein $V_{REF}=V_{DD}-V_{SW}$. The voltage swing limits the swing of the control voltage ($V_C,V^*_C$) output by the timing capacitors as well as the swing of the output clock signal ($V_O,V^*_O$).

Switching block 130 is implemented by n-channel CMOS switching transistors M1 and M2 that have their drains coupled to the drains of load transistors M3 and M4. The gate of switching transistor M1 is cross-coupled to the drain of load transistor M4, and the gate of switching transistor M2 is cross-coupled to the drain of load transistor M3. The output clock signal ($V_O,V^*_O$) is provided at the coupled drains of the load and switching transistors.

Slope-fixing circuit 120 is implemented by timing capacitors $C_1$ through $C_N$ and grounded current sources 104 and 106. Current sources 104 and 106 each provide a reference current I, the value of which may be established by a loop filter voltage $V_{LF}$ and a voltage-to-current converter 122 (see FIG. 7). Timing capacitor $C_1$ is fixably connected between the sources of switching transistors M1 and M2, and timing capacitors $C_2$ through $C_N$ are switchably connected in parallel with capacitor $C_1$. The effective capacitance C provided by the timing capacitors is programmable through the placement of selected ones of capacitors $C_2$ through $C_N$ in parallel with capacitor $C_1$, wherein $$\frac{1}{C} = \sum_i \frac{1}{C_i}$$

(where i ranges from 2 to N and over the indices of those of the capacitors that are connected). The slope of the control voltage ($V_C,V^*_C$), in turn is determined by the ratio (I/C) of the control current to the timing capacitance.

Figure 5:
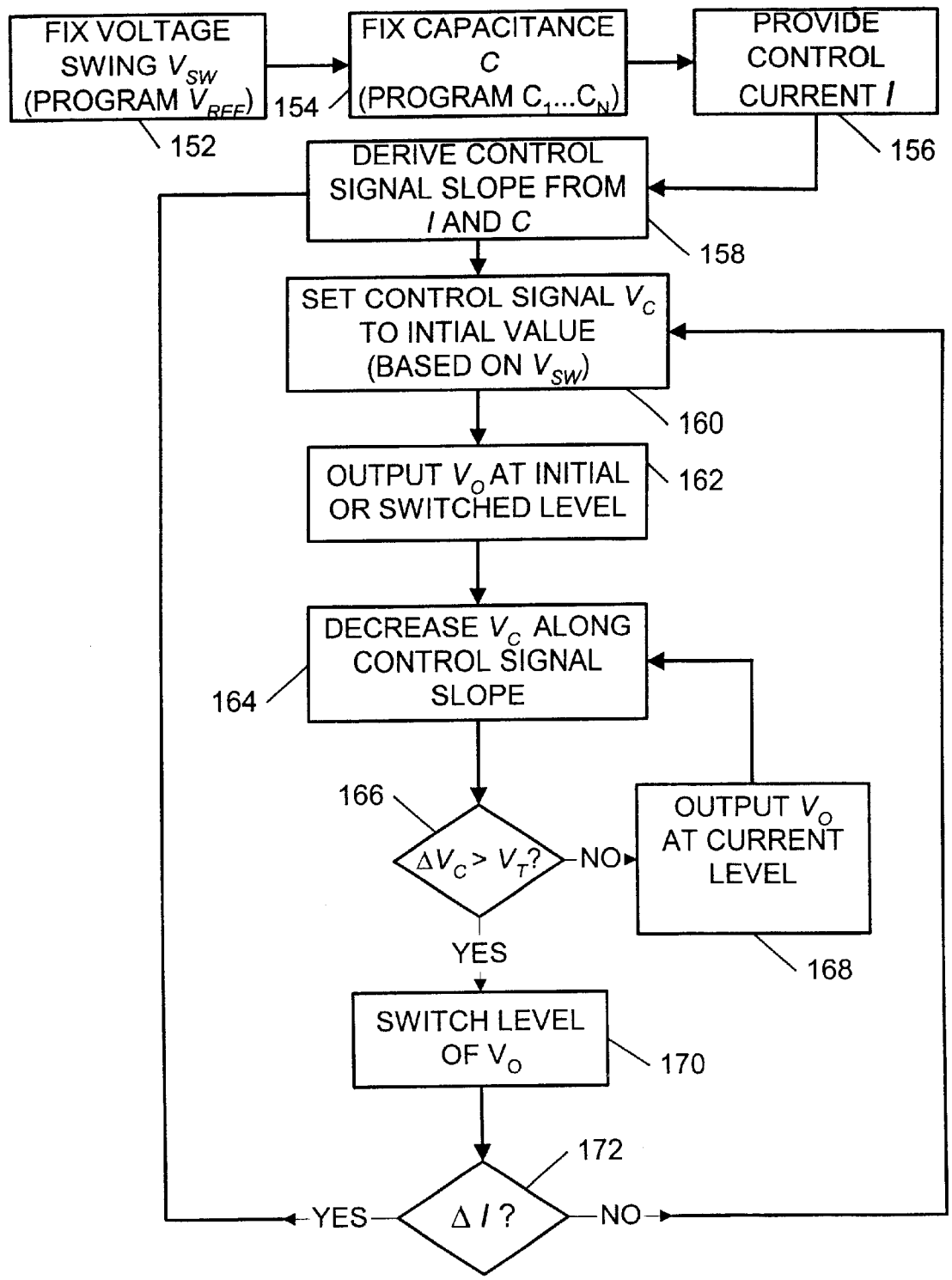
FIG. 5 is a flowchart describing the operation of a relaxation oscillator according to the present invention.
Figure 6:
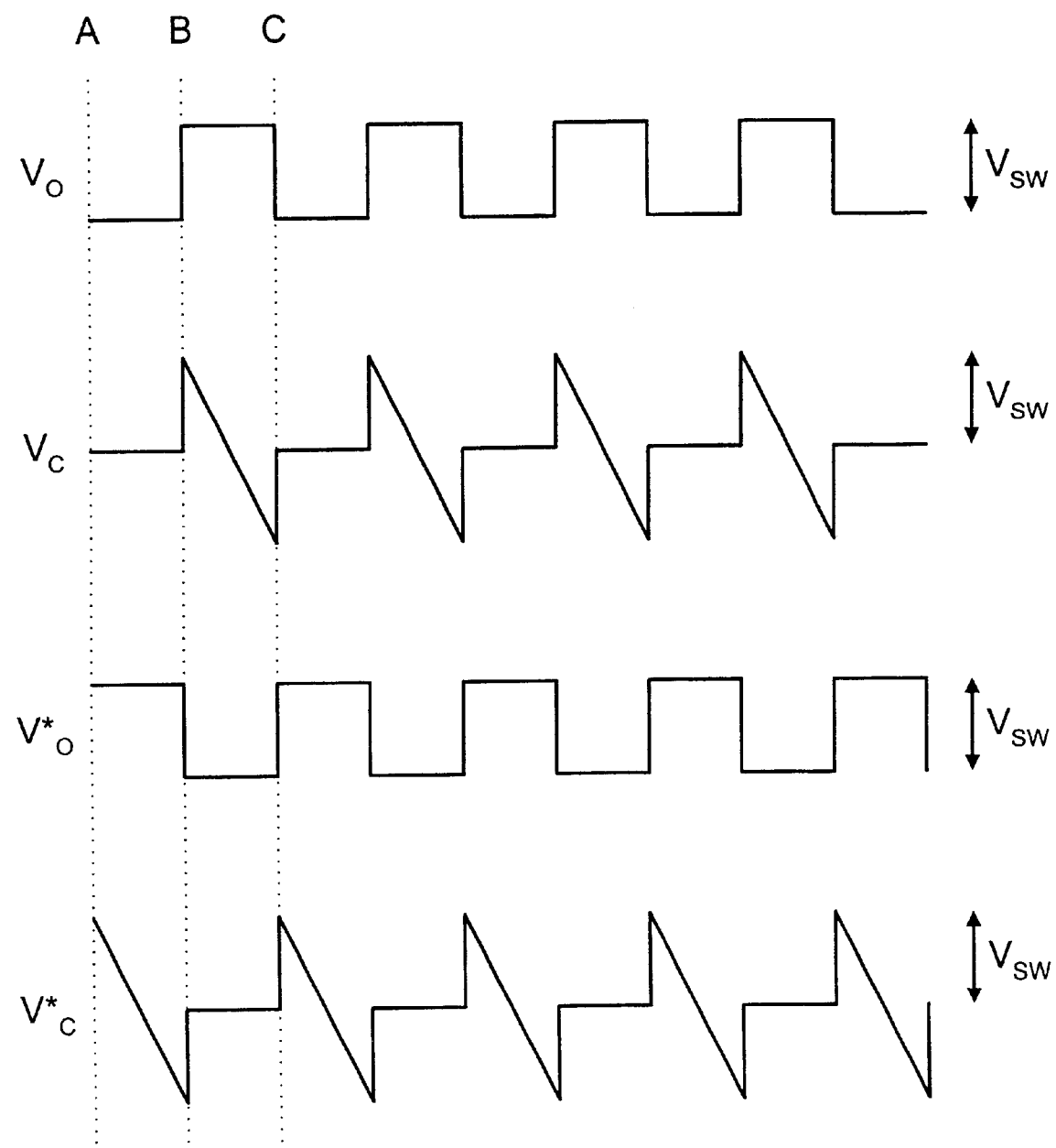
FIG. 6 is a timing diagram showing voltage waveforms at various points in the relaxation oscillator of FIG. 3.

The output signal ($V_O,V^*_O$) of oscillator 100 has a frequency that bears a certain relationship to the swing voltage $V_{SW}$, the effective capacitance C, and the control current I. With reference to FIG. 5, which depicts a method of generating the oscillating output signal; FIG. 6, which is a timing diagram depicting the output signal ($V_O,V^*_O$) and control voltage ($V_C,V^*_C$); and FIG. 4, which is a circuit implementation of the method, this relationship is derived as follows.

In step 152, the oscillating frequency is fine-tuned by fixing the voltage swing $V_{SW}$ according to the relationship $V_{SW}=V_{DD}-V_{REF}$. The reference voltage $V_{REF}$ is digitally programmable from a range of incremental reference voltages $V_{REF1} \ldots V_{REFM}$ to yield a corresponding range of swing voltages. In step 154, the oscillating frequency is coarse-tuned by fixing the effective timing capacitance C. Appropriate switchable timing capacitors $C_2 \ldots C_N$ are selected such that, when placed in parallel with fixed capacitor $C_1$, an effective capacitance C is fixed, wherein $$\frac{1}{C} = \sum_i \frac{1}{C_i}.$$

In step 156, a control current I is provided. Control current I may be established by a loop filter voltage $V_{LF}$ and a voltage-to-current converter 122 (see FIG. 7). It will be appreciated that steps 152, 154 and 156 may be performed in any order.

The slope (or charge/discharge rate) of the control voltage ($V_C, V^*_C$) applied to the sources of switching transistors M1 and M2 is derived, in step 158, from the control current I and effective capacitance C. More particularly, the slope is given by the ratio of the control current to the effective capacitance (I/C).

Load transistors M3 and M4 present effective load resistances of, respectively, $R_{M3}$ and $R_{M4}$. These effective load resistances are assumed equal and are defined as follows:

$$R_{LOAD} = R_{M3} = R_{M4} = \frac{1}{\mu_P C_{OX}(V_{GS3,4} - V_{T3,4})(W/L)_{3,4}}.$$

Assume, in an initial state (time "A" in FIG. 6), that switching transistor M1 is turned off and switching transistor M2 is turned on. Since switching transistor M2 is turned on, current flows through switching transistor M2 and load transistor M4. Ignoring gate currents, the current flowing through transistors M2 and M4 is equal to 2I. The output voltage $V_O$ at the drain of load transistor M4, therefore, is:

$$V_O = V_{DD} - 2IR_{LOAD};$$

or $$V_O = V_{DD} - V_{SW}$$

Since the lack of a drain current turns load transistor M3 off, the output voltage $V^*_O$ at the drain of load transistor M3 is:

$$V^*_O = V_{DD}.$$

Hence, in this initial state at time "A", $V_O$ is low and $V^*_O$ is high (step 162)

Switching transistor M2 is assumed to be in the saturation region since the voltage swing, $V_{SW} = 2IR_{LOAD}$, is typically smaller than the threshold voltage $V_{T2}$ of transistor M2. For example, assuming that the reference voltage is appropriately programmed to yield a swing voltage of 0.6V, giving oscillator 100 a 1.2V peak-to-peak differential swing, the threshold voltage $V_{T2}$ is normally larger than 0.6V. The control voltage $V_C$ at the source of switching transistor M2 is given by:

$$V_C = V^*_O - V_{GS2} = V_{DD} V_{T2} - \Delta_2;$$

where $\Delta_2$ is the minimum saturation voltage of switching transistor M2. No current flows through transistor M1 hence, the initial control voltage $V^*_C$ at the source of transistor M2 is a function of the swing voltage (step 162):

$$V^*_C = V_O = V_{DD} V_{SW}.$$

The flow of current through transistors M4 and M2 charges the capacitors on transistor M2 side ($V_C$), and steadily increases the negative charge on its transistor M1 side ($V^*_C$). The rate of decrease of $V^*_C$ from its starting value at time "A" is equal to the slope I/C (step 164). So long as $\Delta V^*_C$ is less than the threshold voltage $V_{T1}$ of transistor M1, transistor M1 remains off and transistor M2 remains on and, accordingly, the output $V_O$ remains low and the output $V^*_O$ remains high (step 168). When $V^*_C$ becomes sufficiently negative to cause the gate-to-source voltage across transistor M1 to exceed the threshold voltage of transistor M1, that is, when $V_O - V^*_C > V_{T1}$ transistor M1 turns on. Substituting for $V_O$, transistor M1 turns on when:

$$V^*_C < V_{DD} - V_{SW} - V_{T1}.$$

The resulting voltage drop at the gate of transistor M2 (through its coupling to the drain of transistor M3) turns transistors M2 and M4 off. A current 2I now flows through transistors M3 and M1, with a current I flowing through the capacitors in the opposite direction. By virtue of the current flow, $V^*_O$ drops from high ($V_{DD}$) to low ($V_{DD} - V_{SW}$). Conversely, as no current flows through transistors M4 and M2, $V_O$ jumps from low ($V_{DD} - V_{SW}$) to high ($V_{DD}$) (step 170). This output level switch is illustrated at time "B" in FIG. 6. The voltage jump $V_C - V^*_C$ that occurs across the capacitors when the transistors change states is given by:

$$V_C - V^*_C = (V_{DD} - V_{T2} - \Delta_2) - (V_{DD} - V_{SW} - V_{T1}) = V_{SW} - \Delta_2;$$

where $V_{T1}$ and $V_{T2}$ are assumed to be equal. If $\Delta_2 << V_{SW}$, then $V_C - V^*_C \approx V_{SW}$. This assumption is reflected in FIG. 6.

At the time of the state switch, the current I may be adjusted if necessary to align the output clock signal $V_O$ in phase or frequency with the reference clock signal (step 172). If the control current is adjusted, the slope of the control voltage (I/C) will be altered, which ultimately affects the frequency of the output signal. If no frequency adjustment is necessary, the process is repeated without a change in control voltage slope.

Following the state switch at time "B", the capacitors begin to charge in the opposite direction. Now the control voltage $V_C$ at the source of transistor M2 decreases at a rate equaling the programmed slope. Until $V_C$ becomes negative enough to turn transistor M2 on, $V_O$ stays high and $V^*_O$ stays low. At time "C", when the control voltage becomes negative enough that the gate-to-source voltage of transistor M2 exceeds the threshold voltage of transistor M2, another state switch occurs. In this manner, the output voltages $V_O$ and $V^*_O$ take the form of oscillating square waves (180° out-of-phase). The capacitor voltage changes by $2(V_C - V^*_C)$ and the oscillation period T is determined as follows:

$$T = 2 \cdot \left( \frac{C \cdot 2(V_{SW} - \Delta_2)}{I} \right);$$

$$T = \frac{4CV_{SW}}{I}\left(1 - \frac{\Delta_2}{V_{SW}}\right);$$

$$T \approx \frac{4CV_{SW}}{I}; \quad \text{if } \Delta_2 << V_{SW}$$

Hence, the period T of oscillator 100 is fully characterized by the programmed effective capacitance C, the programmed voltage swing $V_{SW}$ and the control current I, so long as the ratio of the minimum saturation voltage of the switching transistors to the voltage swing $$\left( \frac{\Delta_{1,2}}{V_{SW}} \right)$$

is negligible. The output frequency $f_{OUT}$ of oscillator 100, then, is given by:

$$f_{OUT} \approx \frac{I}{4CV_{SW}}$$

The sensitivity of the oscillator to changes in the control current, or the frequency gain, is designated:

$$K_{CCO} = \frac{\Delta f}{\Delta I}$$

Assuming a fixed effective capacitance C and a fixed voltage swing $V_{SW}$, the sensitivity of the oscillator to changes in the control current is:

$$K_{CCO} = \frac{1}{4CV_{SW}}$$

Similarly, for a voltage-controlled oscillator, the sensitivity of the oscillator to changes in the control (loop filter) voltage is:

$$K_{VCO} = \frac{1}{4CV_{SW}}$$

Figure 7A:
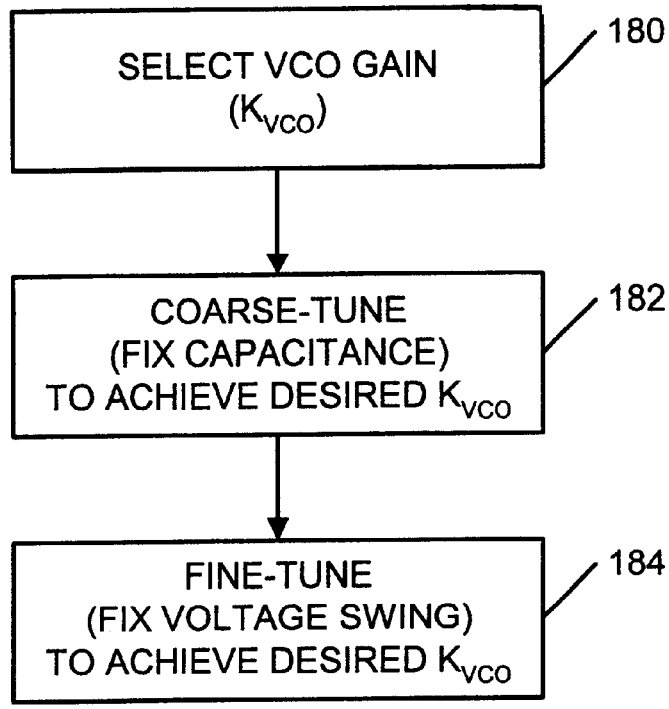
FIG. 7a is a flowchart depicting a method of programming the sensitivity of a current-controlled relaxation oscillator according to the present invention.
Figure 7B:
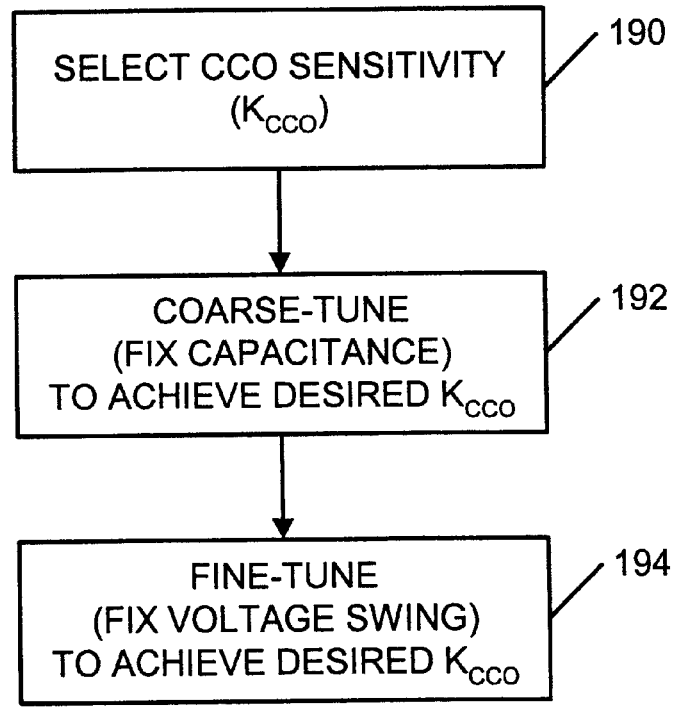
FIG. 7b is a flowchart depicting a method of programming the gain of a voltage-controlled relaxation oscillator according to the present invention.

FIGS. 7a and 7b depict methods for programming VCO and CCO sensitivity or gain that take advantage of these relationships. In FIG. 7a, a method for programming the VCO gain $K_{VCO}$ is provided. In step 180, a desired gain $K_{VCO}$ is selected. In step 182, the VCO gain is coarse-tuned by fixing the capacitance C to achieve the selected $K_{VCO}$, and in step 184, the VCO gain is fine-tuned by fixing the voltage swing $V_{SW}$ to achieve the selected $K_{VCO}$. Similarly, in FIG. 7b, a method for programming the CCO sensitivity $K_{CCO}$ is provided. In step 190, a desired sensitivity $K_{CCO}$ is selected. In step 192, the CCO sensitivity is coarse-tuned by fixing the capacitance C to achieve the selected $K_{CCO}$, and in step 194, the CCO sensitivity is fine-tuned by fixing the voltage swing $V_{SW}$ to achieve the selected $K_{CCO}$.

Additional detail regarding the foregoing is available in "A Low Power, Wide Linear-Range CMOS Voltage-Controlled Oscillator," Woogeun Rhee, IEEE International Symposium on Circuits and Systems, Monterey, Calif., 1998, hereinafter "Rhee Article," which is fully incorporated by reference as though set forth in full.

Figure 8:
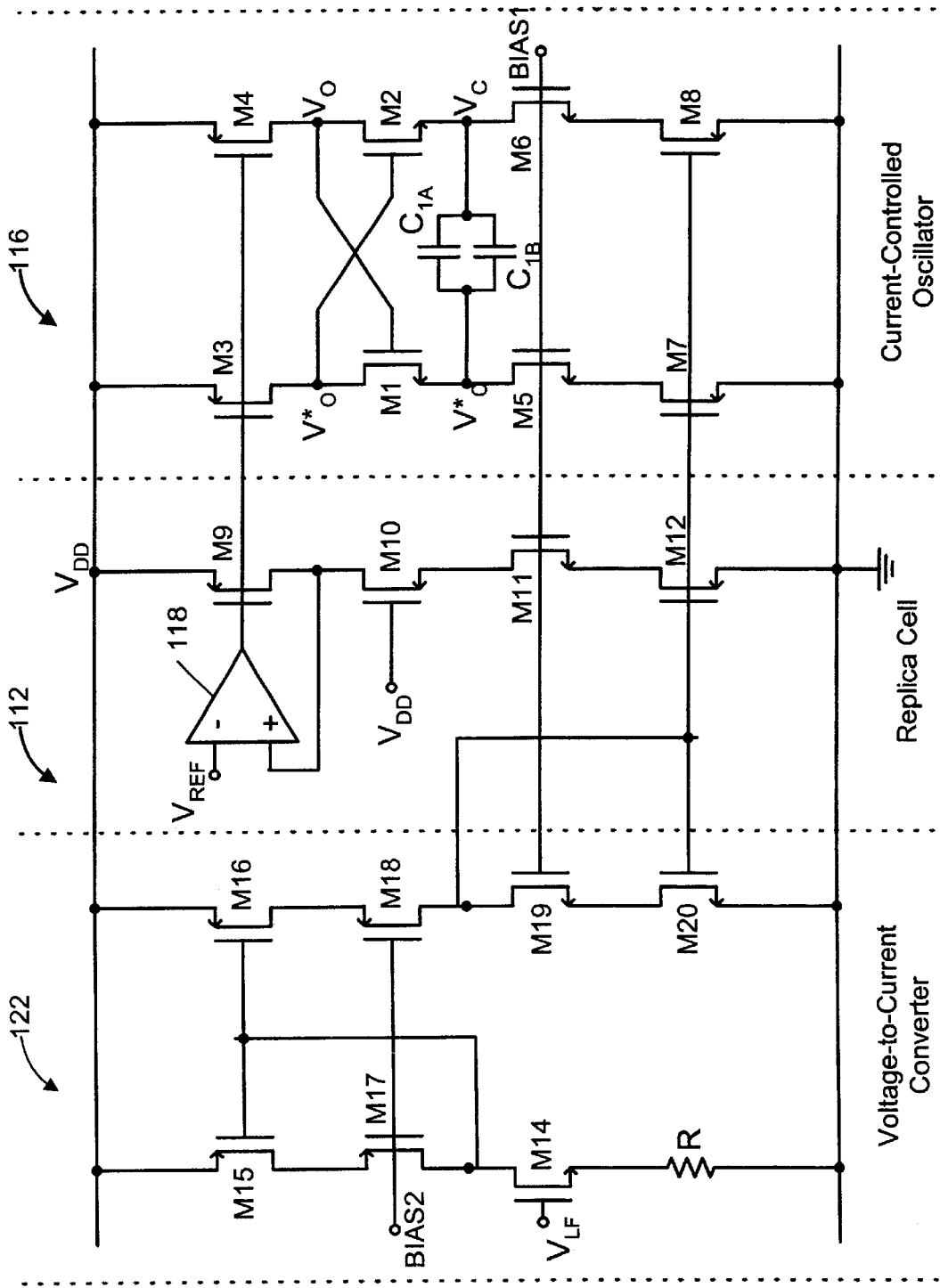
FIG. 8 is a detailed circuit diagram of a relaxation oscillator according to the present invention.

FIG. 8 is a more detailed schematic of a circuit implementation of oscillator 100. Oscillator 100 is implemented in three stages: a voltage-to-current converter stage 122, a replica cell stage 112 and a current-controlled oscillator stage 116. High oscillation speeds mandate the use of NMOS transistors (M1, M2, M5–M8, M10–M12, M14, M19 and M20) in cooperation with PMOS load transistors (M3, M4, M9 and M15–M18).

The current-controlled oscillator stage 116 was substantially described in relation to FIGS. 3–7. In this implementation, switching transistors M1 and M2 have an aspect ratio of 48/0.35. A 1.2V peak-to-peak differential swing (0.6V voltage swing) and a power supply of 2.5V are also used in this implementation. Load transistors M3 and M4 have an aspect ratio of 24/1.0. Two timing capacitors $C_{1A}$ and $C_{1B}$ are connected in parallel between the sources of switching transistors M1 and M2. Current sources 104 and 106 (FIG. 4) are embodied by cascoded current mirror transistor pairs M5, M7 and M6, M8. The current I flowing through transistor pair M5, M7, therefore, is substantially the same as the current I flowing through transistor pair M6, M8.

Transistor pairs M19, M20 and M11, M12 mirror the control current I to current-controlled oscillator stage 116. The gates of cascode transistors M5 and M6 are coupled to the gates of cascode transistors M11 and M19, and are tied to a bias voltage BIAS1, while the gates of mirror transistors M7 and M8 are coupled to the gates of mirror transistors M12 and M20. The drains of cascode transistors M5 and M6 are connected to the sources of transistors M1 and M2 and have timing capacitors $C_{IA}$ and $C_{IB}$ coupled in parallel therebetween to provide the control voltages ($V_C, V^*_C$). The sources of cascode transistors M5 and M6 are coupled to the drains of mirror transistors M7 and M8, and the sources of mirror transistors M7 and M8 are grounded. In this implementation, transistors M5 and M6 have an aspect ratio of 20/0.35, transistors M7 and M8 have an aspect ratio of 28/1.2, and transistors M11 and M12 have an aspect ratio of 14/1.2

Transistors M9, M10 and operational amplifier 118 comprise replica cell 112. The output of amplifier 118 is coupled to the gate of transistor M9 and the gates of oscillator load transistors M3 and M4. The source of transistor M9 is coupled to the supply voltage $V_{DD}$ (2.5 V) and the drain of transistor M9 is coupled to the positive input of amplifier 118, thereby constituting a feedback loop. The drain of transistor M9 is also coupled to the drain of transistor M10, whose gate is set to the supply voltage. The reference voltage $V_{REF}$ is digitally programmable and is supplied to the negative input of amplifier 118.

Replica cell 112 fixes the value of the voltage swing $V_{SW}$ to the difference between the supply voltage and the reference voltage ($V_{SW}=V_{DD}-V_{REF}$). More particularly, amplifier 118 sets $V_{DD}-V_{SW}$ to $V_{REF}$. In one implementation example, $V_{REF}$ is set at 1.9V and the tail current I is set at 300 µA. Solving for $R_{LOAD}$ ($V_{SW}=2IR_{LOAD}$) yields an effective load resistance across each of transistors M3 and M4 of 1 KΩ and a voltage swing of 0.6V. As shown in FIG. 4, in a preferred implementation example, $V_{REF}$ is selectable from a plurality of voltages $V_{REF1} \ldots V_{REFM}$. This permits a user to program the voltage swing and to thereby fine-tune the oscillation frequency. Transistor M9 has an aspect ratio of 5/1.0 and transistor M10 has an aspect ratio of 12/0.35.

Voltage-to-current converter 110 generates a control current I proportional to the value of an input voltage $V_{LF}$ to the gate of transistor M14. The amplitude of $V_{LF}$ is representative of necessary adjustments to the frequency of oscillator 100. In a conventional phase-locked loop, such as that illustrated in FIG. 1, $V_{LF}$ is the voltage developed across a loop filter from the output current of a charge pump. A resistor R is connected in series between the source of transistor M14 and ground. Application of the loop filter voltage across resistor R generates the control current I, which is mirrored to current-controlled oscillator stage 116.

Transistor pairs M15, M17 and M16, M18 comprise a cascoded PMOS current mirror. The sources of mirror transistors M15 and M16 are tied to the supply voltage; and their gates are coupled to the drain of transistor M14. Hence, the control current I developed across resistor R is mirrored through transistors M15 and M16. The drains of mirror transistors M15 and M16 are connected to the sources of cascode transistors M17 and M18. The gates of cascode transistors M17 and M18 are regulated by bias voltage BIAS2; and their drains are coupled to the drains of NMOS transistors M14 and M19. The drain of transistor M18 is also coupled to the gates of mirror transistors M20, M12, M7, M8 in order to mirror the control current to the oscillator. Transistor pair M19 and M20 is coupled in a cascoded mirror configuration with transistor pairs M11, M12; M5, M7; and M6, M8.

The aspect ratios of transistors M14–M20 in this implementation are as follows: transistor M14, 200/0.35; transistor M15, 100/0.7; transistor M16, 50/0.7; transistor M17, 100/0.35; transistor M18, 50/0.35; transistor M19, 7/0.35; and transistor M20, 7/1.2. If a 6 KΩ resistor R is used, a transconductance of 300 µA/V is provided. Hence, a loop filter voltage $V_{LF}$ of one volt will result in a control current I of 300 µA that is mirrored to current-controlled oscillator stage 116. The control current generated by voltage-to-current converter 122 is represented in FIG. 4 as two current sources 104 and 106.

Assuming a 6.4 pF timing capacitance (the effective capacitance of parallel capacitors $C_{1A}$ and $C_{1B}$), a 1.9 V replica cell reference voltage, and a 300 µA control current, oscillator 100 generates an output signal having a frequency of 54 MHz. The output waveforms ($V_O, V^*_O$) are essentially as shown in FIG. 3, Assuming a 0.2 pF timing capacitance (all other variables being the same), a 1 GHz oscillation frequency results, although parasitic capacitance does degrade the linearity of the 1 GHz waveform in relation to the 54 MHz waveform. Since the leakage current to the parasitic capacitance also reduces the voltage swing, the operating speed of the oscillator is not degraded significantly.

Figure 9:
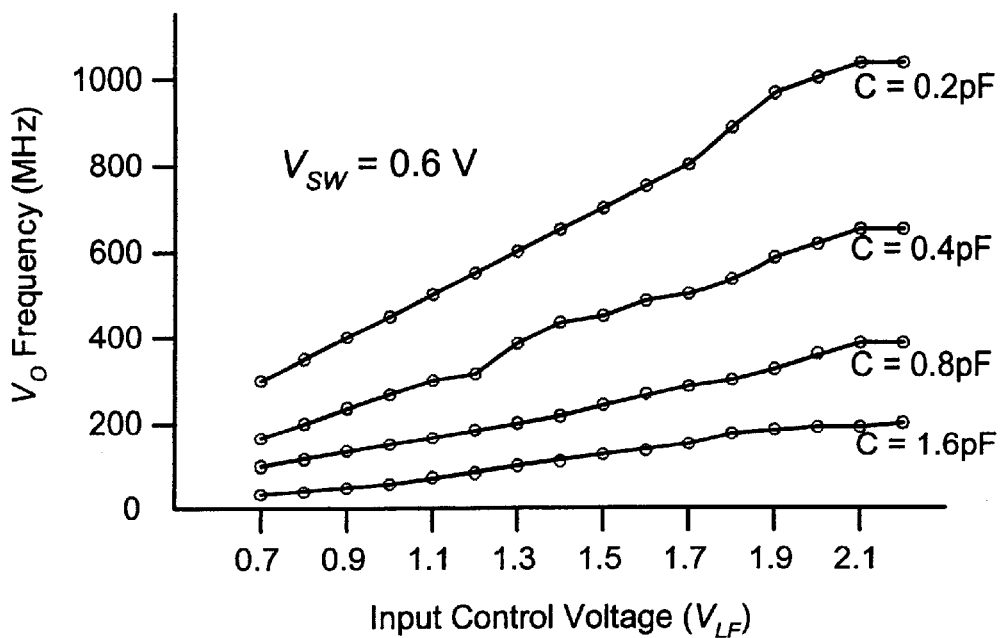
FIG. 9 is a graph plotting the output frequency of the relaxation oscillator as a function of the input control voltage for various timing capacitor values.
Figure 10A:
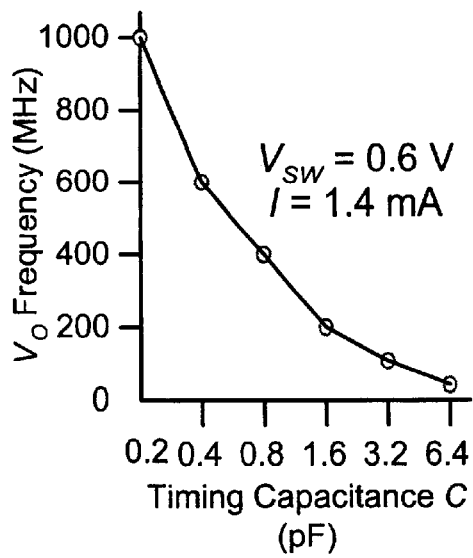
FIG. 10a is a graph plotting the output frequency of the relaxation oscillator as a function of timing capacitor value for a fixed swing voltage and reference current.
Figure 10B:
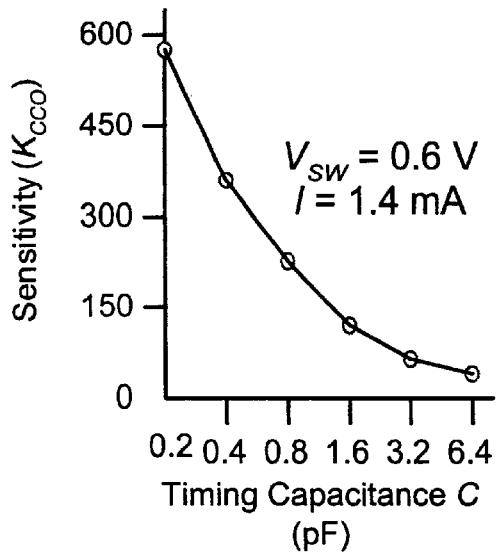
FIG. 10b is a graph plotting the sensitivity of the relaxation oscillator as a function of timing capacitor value for a fixed swing voltage and reference current.

FIGS. 9 and 10 illustrate the voltage-to-frequency, frequency-to-timing capacitance and current sensitivity-to-timing capacitance characteristics for the foregoing implementation of oscillator 100. FIG. 9 plots the input loop filter voltage $V_{LF}$ versus oscillation frequency for effective timing capacitances of 0.2 pF, 0.4 pF, 0.8 pF and 1.6 pF. A voltage swing of 0.6 volts is assumed. As can be seen, for each capacitance value, a substantially linear voltage-to-frequency characteristic is obtained. FIG. 10a plots the output frequency as a function of timing capacitance, with the control current I fixed at 1.4 mA and the voltage swing fixed at 0.6 volts. As can be seen, a 0.2 pF timing capacitance yields an oscillation frequency of 1 GHz. A plot of oscillator current sensitivity $$K_{CCO}\left(\frac{1}{4CV_{SW}}\right)$$

for varying values of C in FIG. 10b graphically depicts the ability to coarse-tune the oscillator sensitivity by varying the timing capacitance. Again, a voltage swing of 0.6 volts and a control current of 1.4 mA are assumed. As indicated, when the capacitance is halved, the sensitivity is reduced by 40–48%. The use of large timing capacitors yields nearly a 50% reduction in sensitivity as parasitic capacitance becomes negligible.

Additional detail on the foregoing implementation example and the accompanying plots is available in the Rhee article, previously incorporated herein by reference.

Figure 11:
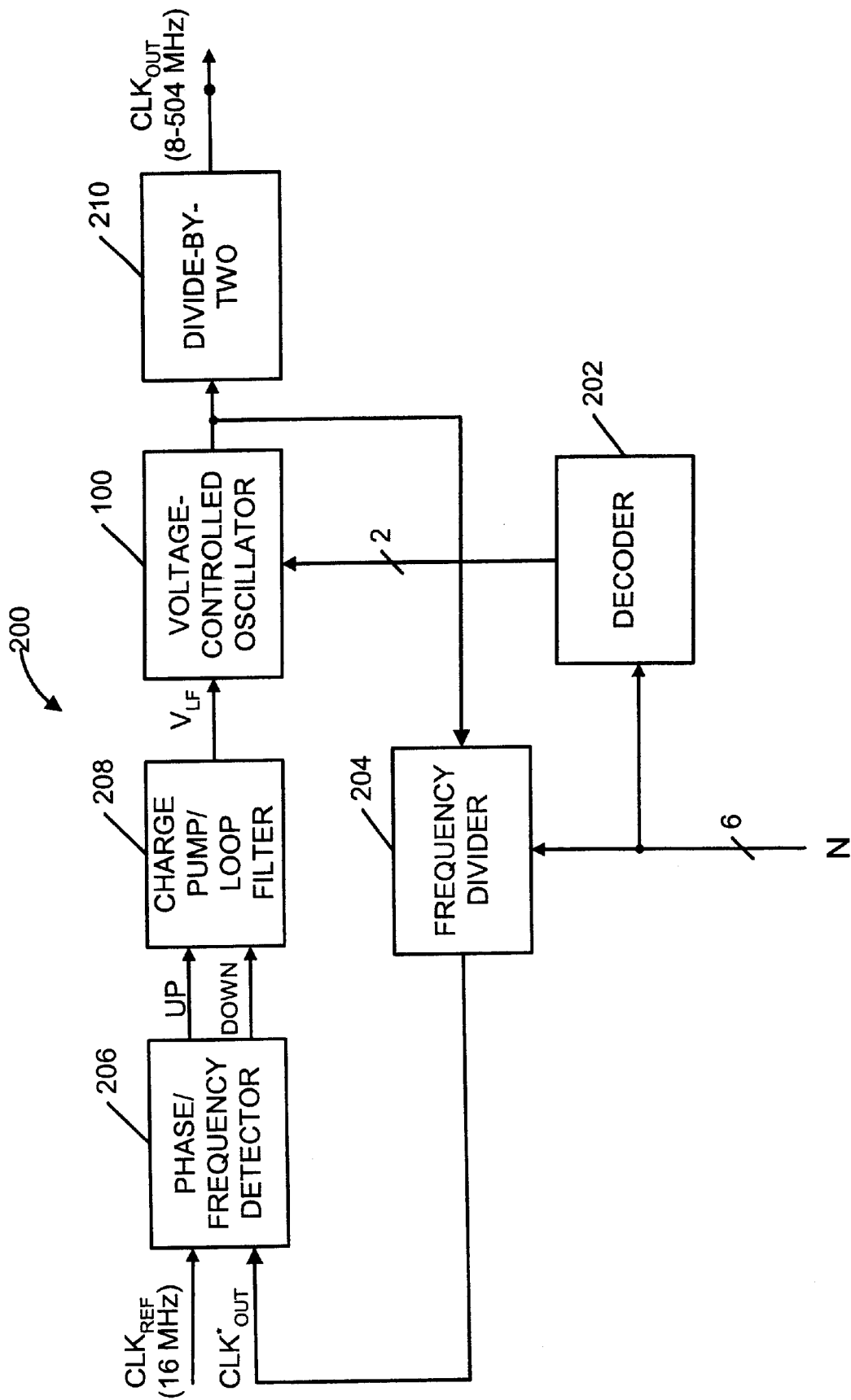
FIG. 11 is a block diagram of a digital clock generator implementing a relaxation oscillator according to the present invention.

One practical implementation of oscillator 100 is in a low-power phase-locked loop or digital clock generator 200 as illustrated in FIG. 11. The gain or sensitivity of oscillator 100 is programmed by decoder 202 in an adaptive way to minimize the variation of loop bandwidth resulting from the different division values (N) used by frequency divider 204. The bandwidth of clock generator 200 is approximately given by:

$$BW \cong \frac{K_{PD}K_{VCO}}{N};$$

where $K_{PD}$ is the gain of phase/frequency detector 206 and $K_{VCO}$ is the gain of oscillator 100. The output of VCO 100 is looped back through a 6-bit programmable frequency divider 204, and then to phase/frequency detector 206 for comparison with the reference clock (having a frequency of 16 MHz, for example). The output of phase/frequency detector 206 is passed through charge pump/loop filter 208 to generate a control voltage $V_{LF}$ that is applied to oscillator 100. Further detail regarding the operation of these elements is set forth in the discussion of FIG. 1, above. The output signal of generator 200, after divider 210 halves the frequency of the output signal from VCO 100, is a digital clock having a frequency of 8–504 MHz.

The 6-bit programming signal that sets the division value N for divider 204 is also supplied to decoder 202. Based on this 6-bit signal, decoder 202 outputs a 2-bit signal to VCO 100 effective to select a particular timing capacitor and thereby program the center frequency of VCO 100. The table below lists the 2-bit outputs of decoder 202 and associated timing capacitance C for selected ranges of division factors N:

| N | Decoder Output (VCO Control) |
|---|---|
| 1–16 | 00 (C = 1.6 pF) |
| 17–32 | 01 (C = 0.8 pF) |
| 33–48 | 10 (C = 0.4 pF) |
| 49–64 | 11 (C = 0.2 pF) |

A similar technique could be employed to provide a programmable charge pump. The performance of a programmable charge pump is limited by voltage compliance requirements unless the gain of the VCO is sufficiently high. A low VCO gain (and high phase detector gain), however, is desirable for better jitter performance. By making the center frequency of the VCO programmable, the output voltage of the charge pump needed to control the VCO can be designed to be within the maximum range without increasing the VCO gain.

Figure 2A:
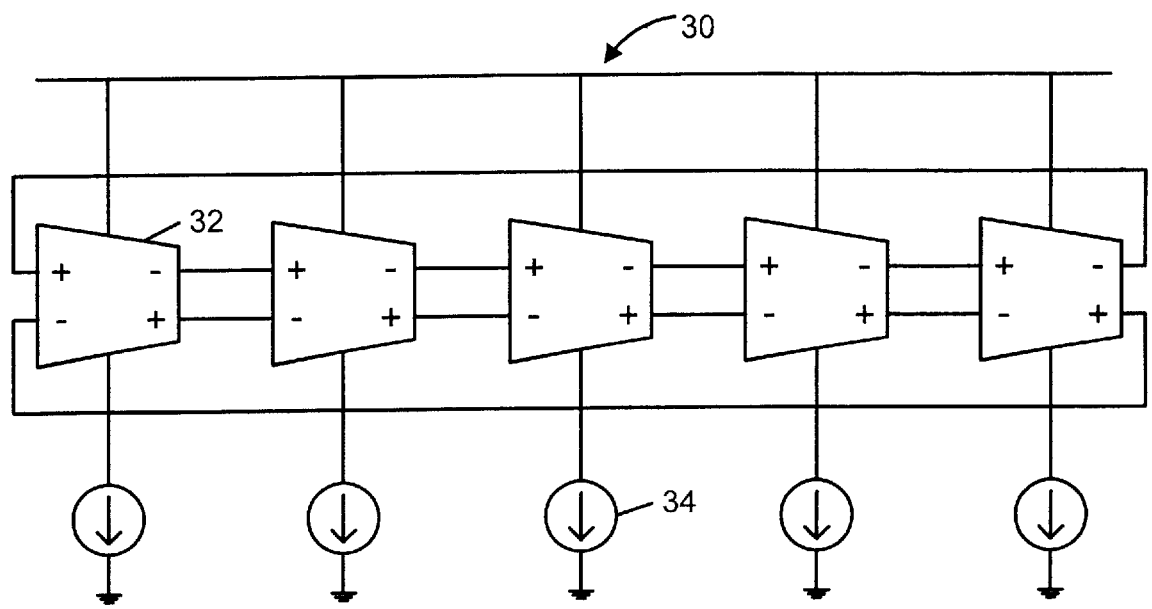
FIG. 2a is a schematic diagram of a ring oscillator.
Figure 2B:
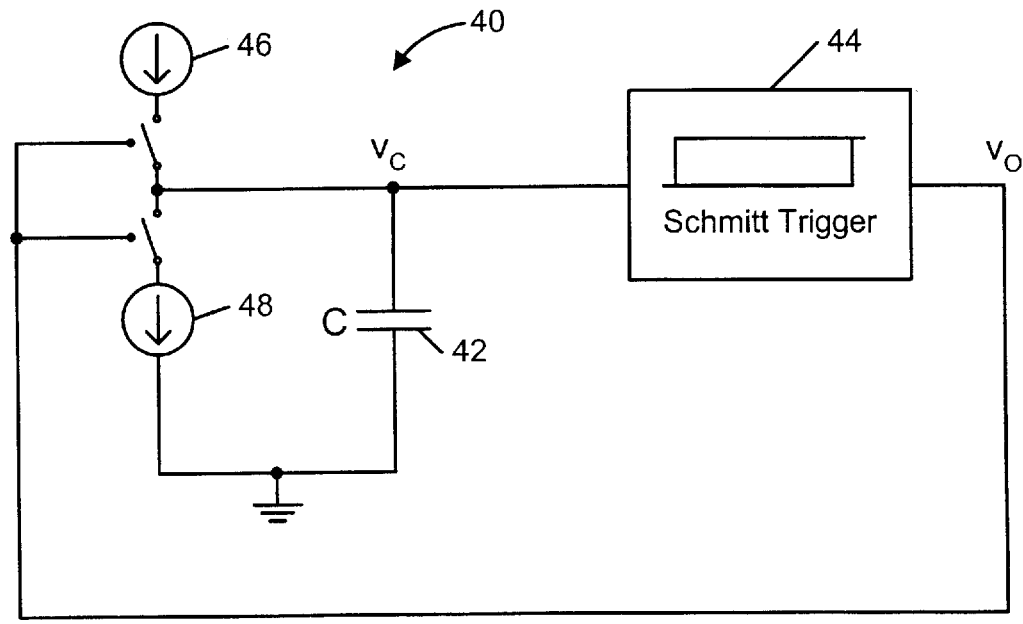
FIG. 2b is a schematic diagram of a relaxation oscillator having a grounded timing capacitor.
Figure 2C:
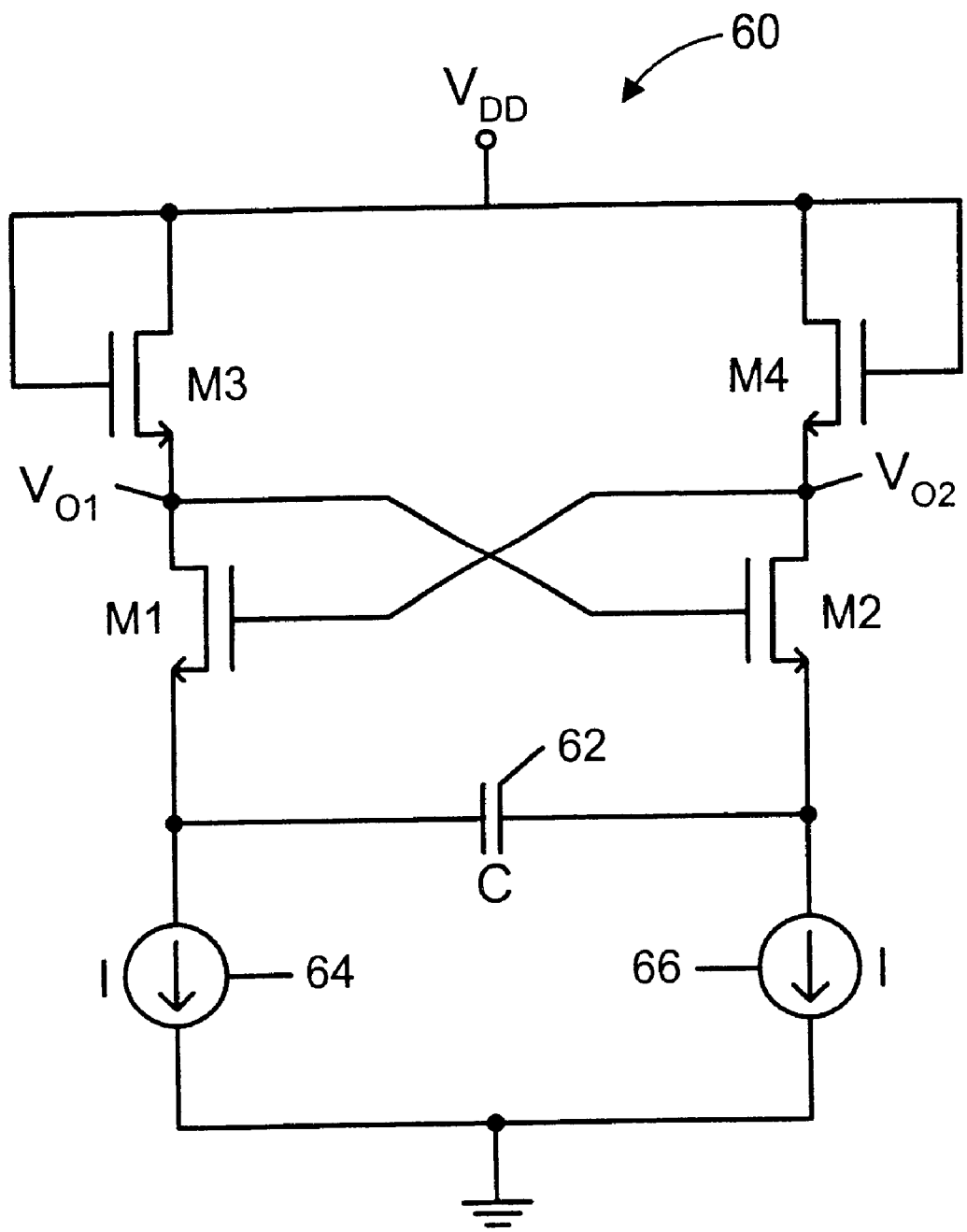
FIG. 2c is a schematic diagram of a source-coupled relaxation oscillator having a floating timing capacitor.

Relative to a ring-oscillator of using differential delay cells (FIG. 2a), VCO 100 has a single stage with fewer transistors, resulting in less power consumption and better noise performance. Since its oscillation frequency is completely defined by the timing capacitors, the tail current and the voltage swing, VCO 100 is less sensitive to process and temperature variations. The tail current of typical ring oscillators also varies significantly, making implementation of a stable replica cell difficult. Relative to a relaxation oscillator having a grounded capacitor (FIG. 2b), VCO 100 consumes less power and provides a differential output. Finally, relative to a conventional relaxation oscillator having a floating capacitor (FIG. 2c), VCO 100 has a wider and programmable linear range and exhibits less sensitivity to process variations.

While particular embodiments of the present invention have been described above, it should be understood that they have been presented by way of example only, and not as limitations. The breadth and scope of the present invention is defined by the following claims and their equivalents, and is not limited by the particular embodiments and implementation examples described herein.

What is claimed is:

1. An oscillator comprising:
    a slope-fixing circuit that generates a control signal and fixes the slope of the control signal, the slope fixing circuit comprising a floating timing capacitor block that has an effective capacitance C and a current supply block that supplies a control current I, wherein the slope of the control signal is determined by the ratio of the control current to the effective capacitance (I/C), and wherein the timing capacitor block comprises a fixed timing capacitor $C_1$ and at least one switchable timing capacitor $C_2$ connected in parallel with $C_1$;
    a swing-fixing circuit that fixes the swing of the control signal; and
    a switching block that generates an oscillator output signal, wherein the oscillator output signal has a frequency derived from the swing and the slope of the control signal.

2. An oscillator as claimed in claim 1, wherein there are a plurality of switchable timing capacitors $C_2 \ldots C_N$, and the effective capacitance C is programmable through the placement of selected ones of timing capacitors $C_2 \ldots C_N$ in parallel with fixed timing capacitor $C_1$.

3. An oscillator as claimed in claim 1, wherein the current supply block sets the value of control current I based on the value of an input signal provided to the oscillator.

4. An oscillator as claimed in claim 3, wherein the input signal is a loop filter voltage $V_{LF}$ developed across a loop filter and supplied to the current supply block, and $V_{LF}$ is representative of phase differences between the oscillator output signal and a reference signal.

5. An oscillator comprising:
   a slope-fixing circuit that generates a control signal and fixes the slope of the control signal, the slope fixing circuit comprising a floating timing capacitor block that has an effective capacitance C and a current supply block that supplies a control current I, wherein the slope of the control signal is determined by the ratio of the control current to the effective capacitance (I/C);
   a swing-fixing circuit that fixes a swing of the control signal, wherein the swing-fixing circuit comprises a replica cell that provides a fixed voltage swing $V_{SW}$, and a variable resistance load that the voltage swing is applied across; and
   a switching block that generates an output signal, wherein the output signal has a frequency derived from the swing and the slope of the control signal.

6. An oscillator as claimed in claim 5, wherein the variable resistance load comprises a pair of load transistors.

7. An oscillator as claimed in claim 6, wherein the load transistors are p-channel CMOS transistors.

8. An oscillator as claimed in claim 7, wherein the sources of the load transistors are connected to a supply voltage, the gates of the load transistors are connected to the replica cell, and the drains of the load transistors are connected to the switching block.

9. An oscillator as claimed in claim 6, wherein the replica cell provides a reference voltage $V_{REF}$ to the gates of the load transistors to fix the voltage swing $V_{SW}$ across the load transistors, and wherein the voltage swing $V_{SW}$ is given by the difference between a supply voltage $V_{DD}$ and the reference voltage $V_{REF}$, $V_{SW}=V_{DD}-V_{REF}$.

10. An oscillator as claimed in claim 9, wherein there is a plurality of incremental reference voltages $V_{REF1} \ldots V_{REFM}$, and the reference voltage $V_{REF}$ is programmable through the selection of one of the reference voltages $V_{REF1} \ldots V_{REFM}$.

11. An oscillator as claimed in claim 9, wherein the replica cell comprises an operational amplifier that receives the reference voltage on its negative input port.

12. An oscillator as claimed in claim 6, wherein the effective load resistance $R_{LOAD}$ of each load transistor is given by $$R_{LOAD} = \frac{V_{SW}}{2I}.$$

13. An oscillator as claimed in claim 6, wherein the switching block comprises a pair of switching transistors that alternate between "on" and "off" states depending on the value of the control signal to produce an oscillating output signal.

14. An oscillator as claimed in claim 13, wherein the switching transistors are n-channel CMOS transistors.

15. An oscillator as claimed in claim 14, wherein the drains of the switching transistors are coupled to the drains of the load transistors, the gates of the switching transistors are cross-coupled to their drains, and the sources of the switching transistors their sources are coupled to the timing capacitor block.

16. An oscillator as claimed in claim 15, wherein the frequency of the output signal is derived completely from the effective capacitance C, the control current I and the voltage swing $V_{SW}$.

17. An oscillator as claimed in claim 16, wherein the frequency of the output signal is given by $$\frac{I}{4CV_{SW}}.$$

18. A relaxation oscillator integrated on a single semiconductor chip comprising:
   a voltage-to-current converter that generates a control current I from an input voltage;
   a current-controlled oscillator that generates an oscillating output signal from the control current I and an internal control signal, the current-controlled oscillator comprising at least one timing capacitor having an effective capacitance C that fixes the slope of the control signal as I/C; a pair of load transistors that fixes the voltage swing $V_{SW}$ of the control signal; and a pair of switching transistors coupled between the at least one capacitor and the load transistors that generate the oscillating output signal based on the internal control signal; and
   a replica cell that provides a reference voltage $V_{REF}$ to the load transistors to fix the voltage swing across the load transistors.

19. A relaxation oscillator as claimed in claim 18, wherein the oscillator has a sensitivity $$K_{CCO} = \frac{1}{4CV_{SW}}.$$

20. A relaxation oscillator as claimed in claim 18, wherein the voltage-to-current converter comprises a control transistor having its gate coupled to the input voltage, and a resistor coupled between the source of the transistor and ground that generates the control current I.

21. A relaxation oscillator as claimed in claim 20, and further comprising a cascoded transistor current mirror that mirrors the control current I from the voltage-to-current converter to the current-controlled oscillator.

22. A relaxation oscillator as claimed in claim 20, wherein the resistor has a resistance of 6 kΩ, and the voltage-to-current converter provides a transconductance of 300 µA/V.

23. A relaxation oscillator as claimed in claim 18, wherein:
   at least one fixed timing capacitor $C_1$ and at feast one switchable timing capacitor $C_2$ are connected in parallel between the sources of the switching transistors;
   the load transistors are a pair of p-channel CMOS transistors having their sources connected to a supply voltage $V_{DD}$ and their gates connected to the reference voltage $V_{REF}$ provided by the replica cell, such that the voltage swing across the load transistors is $V_{SW}=V_{DD}-V_{REF}$; and
   the switching transistors are a pair of n-channel CMOS transistors having their gates cross-coupled to their drains.

24. A relaxation oscillator as claimed in claim 23, wherein:
- a plurality of switchable timing capacitors $C_2 \ldots C_N$ are provided such that the effective capacitance C is programmable through the placement of selected ones of timing capacitors $C_2 \ldots C_N$ in parallel with fixed timing capacitor $C_1$; and
- a plurality of reference voltages $V_{REF1} \ldots V_{REFM}$ are provided such that the voltage swing $V_{SW}$ is programmable through the selection of one of the reference voltages $V_{REF1} \ldots V_{REFM}$.

25. A relaxation oscillator as claimed in claim 24, wherein:
- the switching transistors have an aspect ratio of approximately 48/0.35;
- the load transistors have an aspect ratio of approximately 24/1.0; and
- the supply voltage is approximately 2.5 volts.

26. A relaxation oscillator as claimed in claim 18, wherein the replica cell comprises an operational amplifier that accepts the reference voltage $V_{REF}$ and regulates the load transistors of the current controlled oscillator to maintain the voltage swing $V_{SW}$ at a fixed value.

27. A phase-locked loop comprising:
- a phase/frequency detector that compares a reference clock signal with an output clock signal and generates an appropriate charge pump control voltage;
- a charge pump coupled to the phase/frequency detector that generates a loop filter control current from the charge pump control voltage;
- a loop filter coupled to the charge pump that generates a loop filter voltage from the loop filter control current;
- an oscillator coupled to the loop filter that comprises a slope-fixing circuit that receives the loop filter voltage and generates a control signal having a fixed slope; a swing-fixing circuit that fixes the swing of the control signal; and a switching block that generates the output clock signal, wherein the output clock signal has a frequency derived from the swing and slope of the control signal; and
- a feedback circuit coupled between the oscillator and the phase/frequency detector that provides the output clock signal to the phase/frequency detector, wherein:
- the slope-fixing circuit comprises at least one timing capacitor $C_1$ that provides an effective capacitance C and a current supply that provides a control current I, and the slope of the control signal is I/C;
- the swing-fixing circuit comprises a pair of load transistors and a replica cell that fixes the voltage swing $V_{SW}$ across the load transistors; and
- the switching block comprises a pair of switching transistors coupled between the at least one timing capacitor C1 and the load transistors to produce an oscillating output signal.

28. A phase-locked loop as claimed in claim 27, wherein the timing capacitor $C_1$ is fixed and a plurality of switchable timing capacitors $C_2 \ldots C_N$ are provided such that the effective capacitance C is programmable through the placement of selected ones of timing capacitors $C_2 \ldots C_N$ in parallel with fixed timing capacitor $C_1$.

29. A phase-locked loop as claimed in claim 28, and further comprising a decoder and a programming signal supplied to the decoder, wherein the decoder is coupled to the oscillator and programs the slope-fixing means to generate a particular effective capacitance C based on the programming signal.

30. A phase-locked loop as claimed in claim 29, wherein the feedback circuit comprises a frequency divider that divides the frequency of the output clock signal by a division factor N, the division factor N being provided by the programming signal.

31. A phase-locked loop as claimed in claim 30, wherein the decoder programs an effective capacitance of 1.6 pF for division factors of 1–16; the decoder programs an effective capacitance of 0.8 pF for division factors of 17–32; the decoder programs an effective capacitance of 0.4 pF for division factors of 33–48; and the decoder programs an effective capacitance of 0.2 pF for division factors of 49–64.

32. A method for generating an oscillating output signal $V_O$ comprising the following steps:
- (a) fixing a voltage swing $V_{SW}$ across a variable resistance load;
- (b) fixing an effective timing capacitance C;
- (c) providing a control current I;
- (d) deriving a control signal slope from the control current I and the effective timing capacitance C;
- (e) setting a control signal $V_C$ to an initial value based on the voltage swing $V_{SW}$;
- (f) outputting the signal $V_O$ at an initial level or at a switched level;
- (g) decreasing the control signal $V_C$ along the control signal slope;
- (h) continuing to output the signal $V_O$ at the current level as long as the change in the control voltage $\Delta V_C$ does not exceed a threshold voltage $V_T$;
- (i) switching the level of the output signal $V_O$ when $\Delta V_C$ exceeds the threshold voltage $V_T$;
- (j) repeating the method beginning with step (e) if the control current I has not changed; and
- (k) repeating the method beginning with step (d) if the control current I has changed.

33. A method as claimed in claim 32, wherein in step (a) the voltage swing $V_{SW}$ is fixed according to the relationship $V_{SW}=V_{DD}-V_{REF}$, wherein $V_{DD}$ is a supply voltage and the reference voltage $V_{REF}$ is digitally programmable from a range of incremental reference voltages $V_{REF1} \ldots V_{REFM}$ to yield a corresponding range of swing voltages.

34. A method as claimed in claim 33, wherein in step (a) the voltage swing $V_{SW}$ is applied across a pair of p-channel CMOS load transistors.

35. A method as claimed in claim 32, wherein in step (b) the effective timing capacitance C is fixed by placing appropriate switchable timing capacitors $C_2 \ldots C_N$ in parallel with a fixed capacitor $C_1$.

36. A method as claimed in claim 32, wherein in steps (e) and (f) the output and control voltages $V_O$ and $V_C$ are set at an initial value of approximately $V_{DD}-V_{SW}$, wherein $V_{DD}$ is a supply voltage.

37. A method as claimed in claim 32, wherein in steps (g) and (h) the control voltage $V_C$ is decreased until $\Delta V_C$ exceeds the threshold voltage of an associated switching transistor.

38. A method as claimed in claim 32, wherein in step (i), the level of the output signal is switched by switching the states of a pair of n-channel CMOS transistors.

39. A method for programming the gain or sensitivity $$K_O = \frac{1}{4CV_{SW}}$$

of an oscillator comprising the following steps:
- determining the desired gain $K_O$;
- coarse-tuning the oscillator by selecting an effective capacitance C to achieve the desired gain $K_O$, wherein the oscillator is coarse-tuned by placing appropriate switchable timing capacitors $C_2 \ldots C_N$ in parallel with a fixed capacitor $C_1$ to yield the desired effective capacitance C; and
- fine-tuning the oscillator by selecting a voltage swing $V_{SW}$ across a variable resistance load to achieve the desired gain $K_O$.

40. A method as claimed in claim 39, wherein the oscillator is fine-tuned by programming a reference voltage $V_{REF}$ from a range of incremental reference voltages $V_{REF1} \ldots V_{REFM}$ to fix the voltage swing $V_{SW}$ according to the relationship $V_{SW} = V_{DD} - V_{REF}$, wherein $V_{DD}$ is a supply voltage.

* * * * *